United States Patent
Huang et al.

(10) Patent No.: US 7,519,940 B2
(45) Date of Patent: Apr. 14, 2009

(54) APPARATUS AND METHOD FOR COMPENSATING A LITHOGRAPHY PROJECTION TOOL

(75) Inventors: Hsu-Ting Huang, San Jose, CA (US); Abdurrahman Sezginer, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 220 days.

(21) Appl. No.: 11/203,329

(22) Filed: Aug. 13, 2005

(65) Prior Publication Data

US 2006/0248497 A1 Nov. 2, 2006

Related U.S. Application Data

(60) Provisional application No. 60/677,104, filed on May 2, 2005.

(51) Int. Cl.
*G06P 17/50* (2006.01)
*G01M 11/00* (2006.01)

(52) U.S. Cl. .................. 716/21; 716/19; 356/124; 356/124.5

(58) Field of Classification Search .......... 356/124, 356/124.5, 450, 509–512, 515; 382/144, 382/232, 255, 276, 312; 716/19, 21; 355/53, 355/55, 77

See application file for complete search history.

(56) References Cited

U.S. PATENT DOCUMENTS

| | | | |
|---|---|---|---|
| 5,595,857 A * | 1/1997 | Fukuda et al. ............. 430/311 |
| 5,978,085 A | 11/1999 | Smith et al. | |
| 6,317,198 B1 | 11/2001 | Sato et al. | |
| 6,356,345 B1 | 3/2002 | McArthur et al. | |
| 6,433,878 B1 * | 8/2002 | Niu et al. ................. 356/603 |
| 6,573,986 B2 | 6/2003 | Smith et al. | |
| 6,673,638 B1 * | 1/2004 | Bendik et al. ............. 438/14 |
| 6,700,095 B2 | 3/2004 | Sandstrom et al. | |
| 6,972,853 B1 * | 12/2005 | Stirton et al. ............. 356/630 |

(Continued)

FOREIGN PATENT DOCUMENTS

WO WO 03/056392 7/2003

OTHER PUBLICATIONS

T.A. Brunner, "Impact of Lens Aberrations on Optical Lithography", (IBM Journal of Research and Development, vol. 41, No. 1, 2, 1997).

(Continued)

*Primary Examiner*—Sang Nguyen
(74) *Attorney, Agent, or Firm*—Sheppard Mullin Richter & Hampton LLP

(57) ABSTRACT

An apparatus and method of compensating for lens imperfections in a projection lithography tool, includes extracting from a diffraction image created by the projection lithography tool a lens transmittance function, and then using the extracted lens transmittance function as a compensator in the lithography projection tool. Another preferred apparatus and method of synthesizing a photomask pattern includes obtaining a phase and an amplitude of a transmittance function of an imaging system; forming a computational model of patterning that includes the transmittance function of the imaging system; and then synthesizing a mask pattern from a given target pattern, by minimizing differences between the target pattern and another pattern that the computational model predicts the synthesized mask pattern will form on a wafer.

35 Claims, 6 Drawing Sheets

U.S. PATENT DOCUMENTS

| | | | |
|---|---|---|---|
| 7,079,223 B2* | 7/2006 | Rosenbluth et al. | 355/67 |
| 7,088,419 B2* | 8/2006 | Dowski et al. | 355/18 |
| 7,111,277 B2* | 9/2006 | Ye et al. | 716/21 |
| 7,171,034 B2* | 1/2007 | Wu et al. | 382/144 |
| 7,242,459 B2* | 7/2007 | Shi et al. | 355/77 |
| 7,246,343 B2* | 7/2007 | Joshi et al. | 716/19 |
| 7,266,480 B2* | 9/2007 | Adam | 703/2 |
| 7,325,225 B2* | 1/2008 | Tanaka et al. | 716/21 |
| 7,352,453 B2* | 4/2008 | Mieher et al. | 356/125 |
| 2003/0103189 A1 | 6/2003 | Neureuther et al. | |

OTHER PUBLICATIONS

F.E. Gennari, et al., "Aberrations Are a Big Part of OPC for Phase Shifting Masks", (SPIE, vol. 4562, Nov./Dec. 2001).

F.E. Gennari, et al., "Validation of the Aberration Pattern-Matching OPC Strategy," (SPIE, vol. 4692B, Spring 2002).

P. Dirksen, et al., "Novel Aberration Monitor for Optical Lithography," (SPIE, vol. 3679, pp. 77-86, 1999).

N. R. Farrar, et al., "In-situ Measurement of Lens Aberrations," (SPIE, vol. 4000, p. 18, 2000).

J. F. Chen et al, "Optical proximity correction for intermediate-pitch features using sub-resolution scattering bars," J. Vac. Sci. Technol. B, vol. 15, No. 6, pp. 2426-2433, 1997.

F. Zach, et al., "Aberration Analysis Using Reconstructed Aerial Images of Isolated Contacts on Attenuated Phase-Shift Masks," (SPIE, vol. 4346, p. 1362, 2001).

M. V. D. Kerkhof, et al., "Full Optical Column Characterization of DUV Lithographic Projection Tools," (SPIE, vol. 5377, pp. 1960-1970, 2004).

Bom and E. Wolf, "Principles of Optics," (Chapter 9, Pergmon Press, Oxford, UK, 1985).

B. R. A. Nijboer, "The Diffraction Theory of Aberrations," (Ph.D. Dissertation, University of Groningen, Groningen, The Netherlands, 1942).

F.E. Gennari, et al., "Aberrations Are a Big Part of OPC for Phase Shifting Masks", (SPIE, vol. 4562, Nov./Dec. 2001).

F.E. Gennari, et al., "Validation of the Aberration Pattern-Matching OPC Strategy," (SPIE, vol. 4562B, Spring 2002).

P. Dirksen, et al., "Novel Aberration Monitor for Optical Lithography," (SPIE, vol. 3679, pp. 77-86, 1999).

N. R. Farrar, et al., "In-situ Measurement of Lens Aberrations," (SPIE, vol. 4000, p. 18, 2000).

J. F. Chen et al, "Optical proximity correction for intermediate-pitch features using sub-resolution scattering bars," J. Vac. Sci. Technol. B, vol. 15, No. 6, pp. 2426-2433, 1997.

F. Zach, et al., "Aberration Analysis Using Reconstructed Aerial Images of Isolated Contacts on Attenuated Phase-Shift Masks," (SPIE, vol. 4346, p. 1362, 2001).

M. V. D. Kerkhof, et al., "Full Optical Column Characterization of DUV Lithographic Projection Tools," (SPIE, vol. 5377, pp. 1960-1970, 2004).

Bom and E. Wolf, "Principles of Optics," (Chapter 9, Pergmon Press, Oxford, UK, 1985, pp. 460-461).

B. R. A. Nijboer, "The Diffraction Theory of Aberrations," (Ph.D. Dissertation, University of Groningen, Groningen, The Netherlands, 1942).

F.E. Gennari, et al., "Aberrations are a big part of OPC for phase-shifting masks", (SPIE, vol. 4562, pp. 1077-1086, Nov./Dec. 2001).

F.E. Gennari, et al., "Validation of the aberration pattern-matching OPC strategy," (SPIE, vol. 4692B, pp. 444-453, Spring 2002).

J. F. Chen et al, "Optical proximity correction for intermediate-pitch features using sub-resolution scattering bars," J. Vac. Sci. Technol. B, vol. 15, No. 6, pp. 2426-2433, 1997.

F. Zach, et al., "Aberration Analysis Using Reconstructed Aerial Images of Isolated Contacts on Attenuated Phase Shift Masks," (SPIE, vol. 4346, p. 1362-1368, 2001).

J. E. M. Janssen, "Extended Nijboer-Zernike approach for the computation of optical point-spread functions," (J. Opt. Soc. Am. A., vol. 19, pp. 849-857, 2002).

J. J. M. Braat, et al., "Assessment of An Extended Nijboer-Zernike approach for the computation of optical point spread functions," (J. Opt. Soc. Am. A., vol. 19, pp. 849-857, 2002 [See pp. 1-24, table & 6 drawings]).

J. A. Kong, Electromagnetic Wave Theory, Section 3.4.C,pp. 370-403, EMW Publishing, Cambridge, MA, 2000.

M. Hsu et al., "Lithography Manufacturing Implementation for 65nm and 45nm Nodes with Model-Based Scattering Bars Using IML TM Technology," (SPIE v. 5754 p. 355-367,, 2005).

N. Cobb et al., "Experimental Results on Optical Proximity Correction with Variable Threshold Resist Model," (Proc. of SPIE, vol. 3051, pp. 458-468, 1997).

\* cited by examiner

APPARATUS AND METHOD FOR COMPENSATING A LITHOGRAPHY PROJECTION TOOL

RELATED APPLICATIONS

This application claims priority from U.S. Provisional Patent Application Ser. No. 60/677,104, entitled "Apparatus and Method for Characterizing An Imaging System in Projection Lithography," filed May 2, 2005, and is related to U.S. patent application Ser. No. 11/203,331, now U.S. Pat. No. 7,379,170, entitled "Apparatus and Method for Characterizing An Imaging System in Lithography Projection Tool", filed Aug. 13, 2005, and U.S. patent application Ser. No. 11/203,330, entitled "Apparatus and Method for Photomask Design,"filed Aug. 13, 2005, each of which is hereby incorporated herein by reference in the respective entirety of each. This application is further related to U.S. Pat. No. 7,480,891, U.S. patent application Ser. No. 11/203,522, and U.S. patent application Ser. No. 11/203,498, all of which were filed concurrently with this application on Aug. 13, 2005, and are hereby incorporated herein by reference in the respective entirety of each. Elements of the inventions disclosed in these six patent applications can be used separately or in combination with each other.

BACKGROUND

There have been different kinds of systems and methods related to the optical proximity correction (OPC) for optical projection lithography. Nevertheless, there is a need for a new and improved method of compensating the effects of an imperfect imaging system in a projection lithography tool to facilitate improved optical proximity correction.

BRIEF SUMMARY OF THE INVENTION

The present invention provides a method to compensate the imperfection of a lens imaging system in a projection lithography stepper (or scanner). The imperfection is characterized by both the phase and the amplitude transmittance functions of the projection lens. The complex lens transmittance function can be obtained by measuring and analyzing images of a set of test structures on a test mask. The extracted lens transmittance functions are then used in an image calculation in the OPC process. The corrected mask layout from the OPC process can compensate the projection lens imperfection of the stepper; that is, the target patterns would be accurately printed on the wafer from the corrected mask without suffering the undesired effects from the imperfect imaging system.

BRIEF DESCRIPTION OF THE DRAWINGS

The above mentioned features and steps of the invention and the manner of attaining them will become apparent, and the invention itself will be best understood by reference to the following description of the preferred embodiment(s) of the invention in conjunction with the accompanying drawings wherein.

DETAILED DESCRIPTION OF THE PREFERRED EMBODIMENTS

A method and apparatus for compensating the effects of an imperfect imaging system in a projection lithography tool is disclosed. The following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 1:
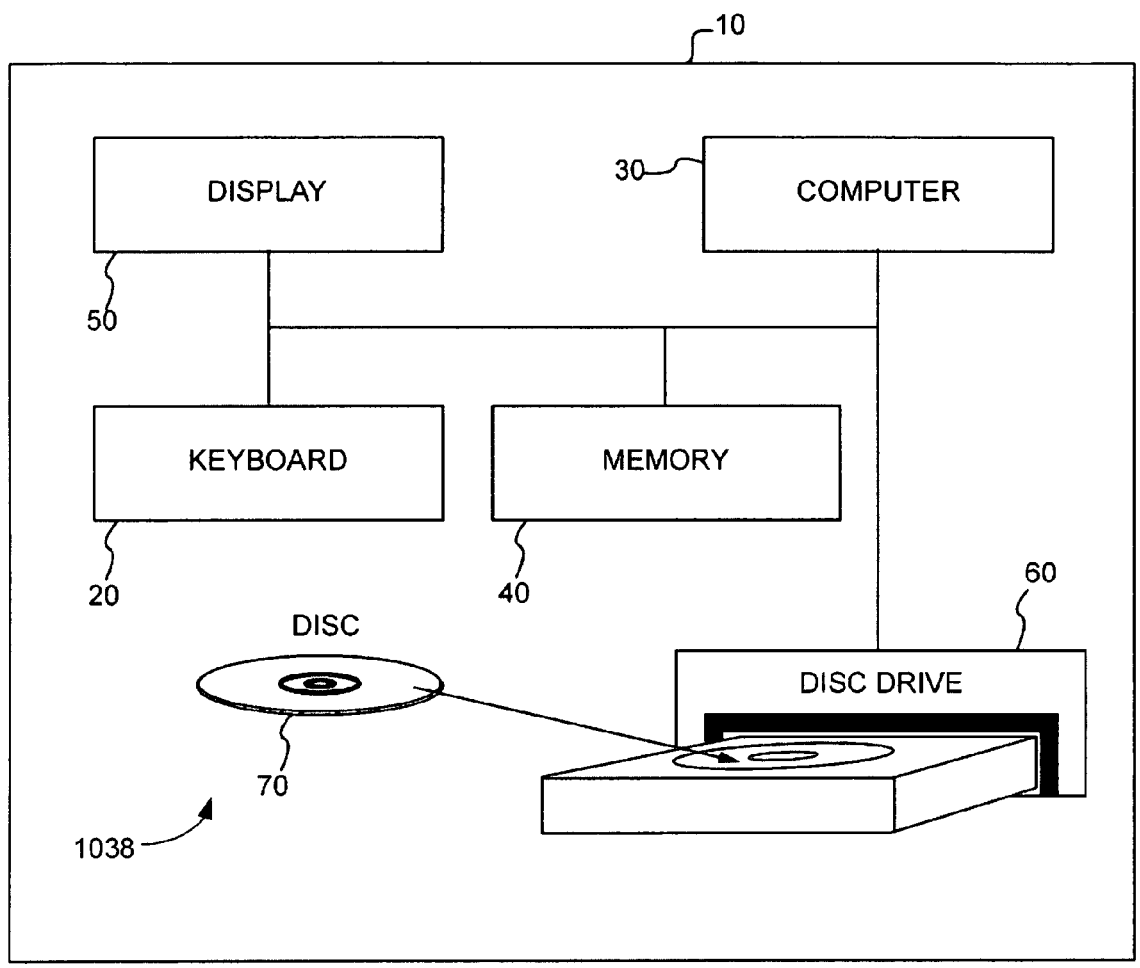
FIG. 1 is a block diagram of a computer aided design system, which is constructed in accordance with a preferred embodiment of the present invention.

Referring now to the drawings and the detailed description that follows, there is illustrated in FIG. 1, a compensating apparatus 10, which provides several different and unique methods of optical proximity correction. In one preferred embodiment of the present invention a method 1038 to compensate the effects of an imperfect imaging system in a projection lithography tool is provided. As will be explained hereinafter in greater detail, the method 1038 for improving a photomask design by optical proximity correction is provided on a computer program product 70, which is a computer usable medium that has encoded thereon computer readable codes. The computer readable codes enable a user, via the apparatus 10, to apply the method 1038 to compensate the effect of an imperfect imaging system in a projection lithography tool. In this regard, the computer readable code causes the apparatus 10 to take the following actions:

a) to obtain both the phase and amplitude parts of a transmittance function for an imaging system in a lithography tool;

b) to cause a computational model of patterning to be formed which includes amplitude and phase maps of the imaging system; and c) to synthesize a mask pattern from a given target pattern, such that the computational model predicts the synthesized mask pattern that will form the target patterns on a wafer.

Imperfections of a projection lens can be characterized by a transmittance function. The transmittance function is the ratio of two electromagnetic wave amplitudes, $a/a_0$, that will be defined shortly. Consider a Gaussian electromagnetic beam that issues from a point on the photomask, travels through the imperfect imaging lens, and arrives at a point (x, y) at the image plane (the wafer). The Gaussian beam is focused at a point (x, y) in the image field, and at its conjugate point on the photomask. The Gaussian beam is approximately a plane wave, having a direction of propagation that can be parametrized by two angular variables: $(\theta, \phi)$. The Gaussian beam has a complex amplitude a, having a phase and a magnitude, at the image plane. The amplitude $a_0$ is the amplitude the Gaussian beam would have if the lens were perfect. Consequently, the transmittance function, $a/a_0$, has a phase and a magnitude. By definition, the transmittance function takes the constant value 1 for a perfect lens. The phase of the transmittance function, known as the wave front error or aberration, is proportional to the optical path error; i.e. a propagation-time delay or gain, associated by the path taken by said beam. The magnitude of the transmittance function indicates a difference in light attenuation associated by the path taken by the beam. The cause of the attenuation can be absorption or scattering in the lens material, scattering of light by surface roughness at the interfaces of optical elements, and angle-dependent partial reflection and transmission at lens interfaces. The transmittance function depends on four independent variables: two angular variables $(\theta,\phi)$ that indicate the direction of propagation of said electromagnetic wave; and two $(x, y)$ coordinates to indicate the point in the image field. The direction of propagation $(\theta,\phi)$ can be mapped onto the pupil of the projection lens. For a realistic imaging system, the phase or amplitude transmittance function is non-uniform (not constant-valued).

In a preferred embodiment, the complex transmittance function is obtained by measuring images of test structures on a wafer having films of deposited materials, the films having substantially the same thicknesses and compositions as some layers on a wafer of devices at a manufacturing stage. In some cases, the complex transmittance function is different in at least two locations in an image field.

In another preferred embodiment, the complex transmittance function is obtained by measuring images of test structures on a wafer where at least one of the test structures has a phase shifted feature.

In still another preferred embodiment, the complex transmittance function is obtained by measuring images of test structures on a wafer where the test structures have a plurality of parallel lines and spaces. In one embodiment, the test structure is a generalized line-grating of parallel lines and spaces where at least two lines have different widths or at least two spaces have different widths. In another embodiment, the lines and spaces of each test structure are oriented in a different direction than those of at least one other test structure. In still yet another embodiment, the generalized line-grating is a chirp line grating having at least three lines and two spaces, wherein the reciprocal of the pitches (reciprocal of the sum of the widths of a line and a space adjacent to the line) are evenly distributed (but not necessary to be monotonically increasing or decreasing) in a spatial frequency domain. Preferably, the chirp line-grating has at least four lines and three spaces, and more preferably at least five lines and four spaces.

Before considering the preferred embodiments of the present invention in greater detail, it may be beneficial to briefly review the state of the art with reference to characterizing imperfections in an imaging system used in projection lithography.

To begin, it should be understood by those skilled in the art that the imperfection of an imaging system in projection lithography is becoming more and more important as the lithographic pattern dimensions continue shrinking. In this regard, an imperfect imaging system in the exposure tool would deteriorate the control of critical dimension and across-chip line width variation.

Figure 2:
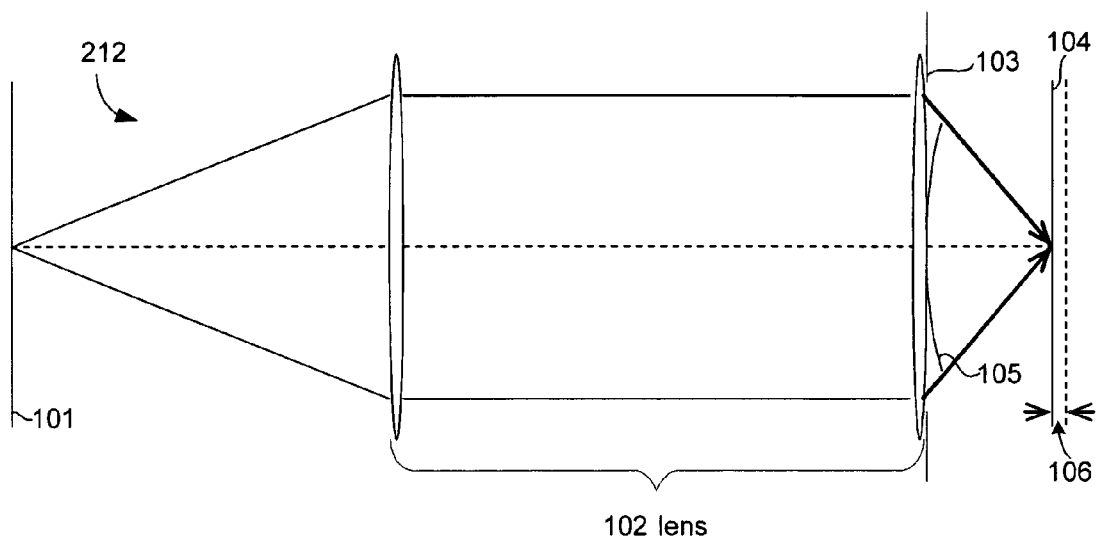
FIG. 2 is a schematic drawing of an imaging system for projection lithography.

A (lens) transmittance function is the transmittance of an electro-magnetic field as a function of position on an exit pupil sphere 105 in an imaging system 212, as best seen in FIG. 2. There are two parts of the complex transmittance function: the phase and the amplitude. The phase part describes the deviation from the perfect optical design and is widely known as a wave front aberration, which is caused by the optical path difference in the projection system 212.

For each point in an image plane, such as an image plane 104, the amplitude and phase parts of the lens transmittance depend on position on the exit pupil sphere 105, or equivalently, the direction of incidence on the image plane 104. The amplitude and phase parts of the lens transmittance also depend on the position in the image plane 104. Therefore, the lens transmittance function is a function of four variables. A non-uniform lens transmittance function has undesirable effects on projection lithographic printing.

The aberration of the lens system (the phase part) is well known for having disadvantageous effects on the optical projection printing, especially when using high numerical aperture (NA) or having a large printing field. For a further discussion of this and other issues, see a published article by T. A. Brunner entitled "Impact of Lens Aberrations on Optical Lithography", (IBM Journal of Research and Development, Vol. 41, Numbers 1, 2, 1997). The Brunner article reviews the impact of lens aberration on optical lithography, and points out that these undesirable effects are sometimes exacerbated through the use of resolution enhancement techniques (RET), such as phase-shift masks, nonstandard illumination, or (optical) proximity correction. See also the article by F. E. Gennari and A. R. Neureuther, entitled "Aberrations Are a Big Part of OPC for Phase Shifting Masks", (SPIE, Vol. 4562, November/December 2001).

Optical proximity correction (OPC) is a method to correct the distortion of projected images due to the diffraction effects. When the pattern dimensions are comparable or smaller than the optical wavelength of exposure, OPC compensates the diffraction effects by correcting the patterns on the photo-mask (or reticle). By applying OPC to mask production, it extends the optical lithography to the level beyond the diffraction limit.

Prior art documents have included lens aberration in the OPC process. For example, Gennari and Neureuther have proposed to enable aberration corrections in optical proximity correction on the mask layout. See F. E. Gennari, G. Robins, and A. R. Neureuther, "Validation of the Aberration Pattern-Matching OPC Strategy," (SPIE, Vol. 4692B, Spring 2002) and A. R. Neureuther, K. Adam, G. C. Robins, F. E. Gennari, "Characterizing Aberrations in an Imaging Lens and Applications to Visual Testing and Integrated Circuit Mask Analysis," (U.S. Patent Application No. 20030103189, published Jun. 5, 2003). However, the method did not correct the non-uniform amplitude attenuation of the lens system.

FIG. 2 is a schematic drawing of the imaging system 212 for projection lithography. The complex transmittance function depicts the amplitude and phase deviations (from the perfect imaging system) of the (optical) wave propagated from the exit pupil sphere 105 toward the image plane (or substrate) 104. In order to compensate the effects of the imperfect imaging system on the projection lithography, measurement of lens transmittance function is required. Many methods have been reported to characterize the projection lens aberrations. See for example the following prior art documents: P. Dirksen, C. Juffermans, R. Pellens, M. Maenhoudt, and P. De Bisschop, "Novel Aberration Monitor for Optical Lithography," (SPIE, Vol. 3679, pp. 77-86, 1999); N. R. Farrar, A. L. Smith, D. Busath, D. Taitano, "In-situ Measurement of Lens Aberrations," (SPIE, Vol. 4000, p. 18, 2000); A. H. Smith, B. B. McArthur, and R. O. Hunter, Jr., "Apparatus Method of Measurement and Method of Data Analysis for Correction of Optical System," (U.S. Pat. No. 5,978,085, 1999); B. B. McArthur and A. H. Smith, "In-situ Source Metrology Instrument and Method of Use," (U.S. Pat. No. 6,356,345, 2002); A. Smith, B. McArthur, R. Hunter, Jr., "Method and Apparatus for Self-Referenced Projection Lens Distortion Mapping," (U.S. Pat. No. 6,573,986, 2003); F. Zach, C. Y. Lin, J. P. Kirk, "Aberration Analysis Using Reconstructed Aerial Images of Isolated Contacts on Attenuated Phase-Shift Masks," (SPIE, Vol. 4346, p. 1362, 2001); and M. V. D. Kerkhof, W. d. Boeij, H. Kok, M. Silova, J. Baselmans, and M. Hemerik, "Full Optical Column Characterization of DUV Lithographic Projection Tools," (SPIE, Vol. 5377, pp. 1960-1970, 2004).

The above-mentioned prior art documents generally disclose using a series of Zernike polynomials to represent the wave front aberration, $\Phi$, in the normalized polar coordinates, $(\rho, \theta)$, on the exit pupil sphere 105.

$$\Phi(\rho, \theta) = \sum_{n,m} \sum_{j=1}^{2} \alpha_{nmj} R_n^m(\rho) \begin{Bmatrix} \cos \\ \sin \end{Bmatrix}_j (m\theta) \quad (1)$$

where $R_n^m$ is a Zernike polynomial and $\alpha_{nmj}$ is its coefficient. The coefficients $\alpha_{nmj}$ quantify the aberration of the system. The index j selects one of the two functions: cosine and sine. The term corresponding to each term is summed in the summation indicated in Equation 1.

The Zernike coefficients can be obtained by measuring images of test structures. The spatial impulse response (or the point-spread function, which is the aerial image of an infinitesimal pinhole object) can be used for the calculation of aerial images of complicated test objects.

The diffraction integral of the point-spread function (transfer function) takes the form shown in Equation 2 based on the work in a publication by M. Born and E. Wolf, entitled, "Principles of Optics," (Chapter 9, Pergmon Press, Oxford, UK, 1985):

$$U(x, y) = U_0 \int_0^1 \int_0^{2\pi} \exp\left[-i\rho^2 f \frac{\pi(NA)^2}{\lambda} + i\Phi(\rho, \theta) + i\rho \frac{2\pi NA}{\lambda}(x\cos\theta + y\sin\theta)\right] \rho d\theta d\rho \quad (2)$$

In Equation 2, NA is the numerical aperture of the objective, $\lambda$ is the exposure wavelength, (x, y) are the Cartesian coordinates on the image plane 104, f is a defocus distance, $U_0$ is a constant factor, and $\Phi(\rho, \theta)$ is the lens aberration (phase of the transmission function) as shown in Equation (1). An analytical, i.e., closed form, approximate solution for the above point-spread function was first derived by Nijboer. See, B. R. A. Nijboer, "The Diffraction Theory of Aberrations," (Ph.D. Dissertation, University of Groningen, Groningen, The Netherlands, 1942). Equation (2) is an approximation that is valid for small-NA (small numerical aperture) imaging, which does not accurately describe modern photolithography. A more accurate calculation will be presented in the description of the preferred embodiment.

In the Nijboer-Zernike theory of diffraction integrals, the phase aberration should not exceed a few radians, and the amplitude attenuation (the amplitude transmission function) is assumed to be substantially constant over the wave front.

Janssen et al. have reported a more general method called the extended Nijboer-Zernike (ENZ) approach, for the computation of optical point-spread function. See A. J. E. M. Janssen, "Extended Nijboer-Zernike Approach for the Computation of Optical Point-Spread Functions," (J. Opt. Soc. Am. A., Vol. 19, pp. 849-857, 2002); and J. J. M. Braat, P. Dirksen, and A. J. E. M. Janssen, "Assessment of An Extended Nijboer-Zernike Approach for the Computation of Optical Point-Spread Functions," (J. Opt. Soc. Am. A., Vol. 19, pp. 858-870, 2002).

The amplitude transmission function $A(\rho, \theta)$ of the lens system is introduced and Equation (2) becomes:

$$U(x, y) = U_0 \int_0^1 \int_0^{2\pi} A(\rho, \theta) \exp\left[-i\rho^2 f \frac{\pi(NA)^2}{\lambda} + i\Phi(\rho, \theta) + i\rho \frac{2\pi NA}{\lambda}(x\cos\theta + y\sin\theta)\right] \rho d\theta d\rho \quad (3)$$

Using the ENZ theory, both the phase and the amplitude of the lens transmittance function can be retrieved. The Nijboer-Zernike theory is an approximation that is valid for small to moderate numerical apertures (NA<0.6). In the ENZ theory, the higher-order wave front terms are included for defocusing in high NA imaging systems, and the path length due to defocusing is properly taken into account if the NA approaches 0.9. However, the polarization state of the focusing wave needs to be included for NA larger than 0.7. Therefore, a vector diffraction representation of the ENZ theory was reported by Braat et. al. See, J. J. M. Braat, P. Dirksen, A. J. E. M. Janssen, A. S. van de Nes, "Extended Nijboer-Zernike Representation of The Vector Field in The Focal Region of An Aberrated High-Aperture Optical System," (J. Opt. Soc. Am. A., Vol. 20, pp. 2281-2292, 2003).

Dirksen et. al. have retrieved the aberration, $\Phi(\rho, \theta)$, using the ENZ approach. See for example, the article by P. E. Dirksen, J. Braat, A. J. E. M. Janssen, C. Juffermans, entitled "Aberration Retrieval Using the Extended Nijboer-Zernike Approach," (J. Microlith. Microfab., Microsyst., Vol. 2, p. 61, 2003.). Phase retrieval was demonstrated both analytically and experimentally. It was suggested that the amplitude transmittance function, $A(\rho, \theta)$, could be also determined. However, they did not teach how to correct the effects of phase and amplitude of lens-pupil function by adjusting the mask layout.

Considering now the preferred embodiment of the present invention, it should be noted that the preferred method 1038, takes into account both the amplitude attenuation, $A(\rho, \theta)$, and the phase distortion, $\Phi(\rho, \theta)$, of a lithography projector when carrying out the (model-based) OPC process. The amplitude and phase of the lens transmission function for an imperfect lens system are compensated for by correcting the shape of the patterns on the mask.

Figure 3A:
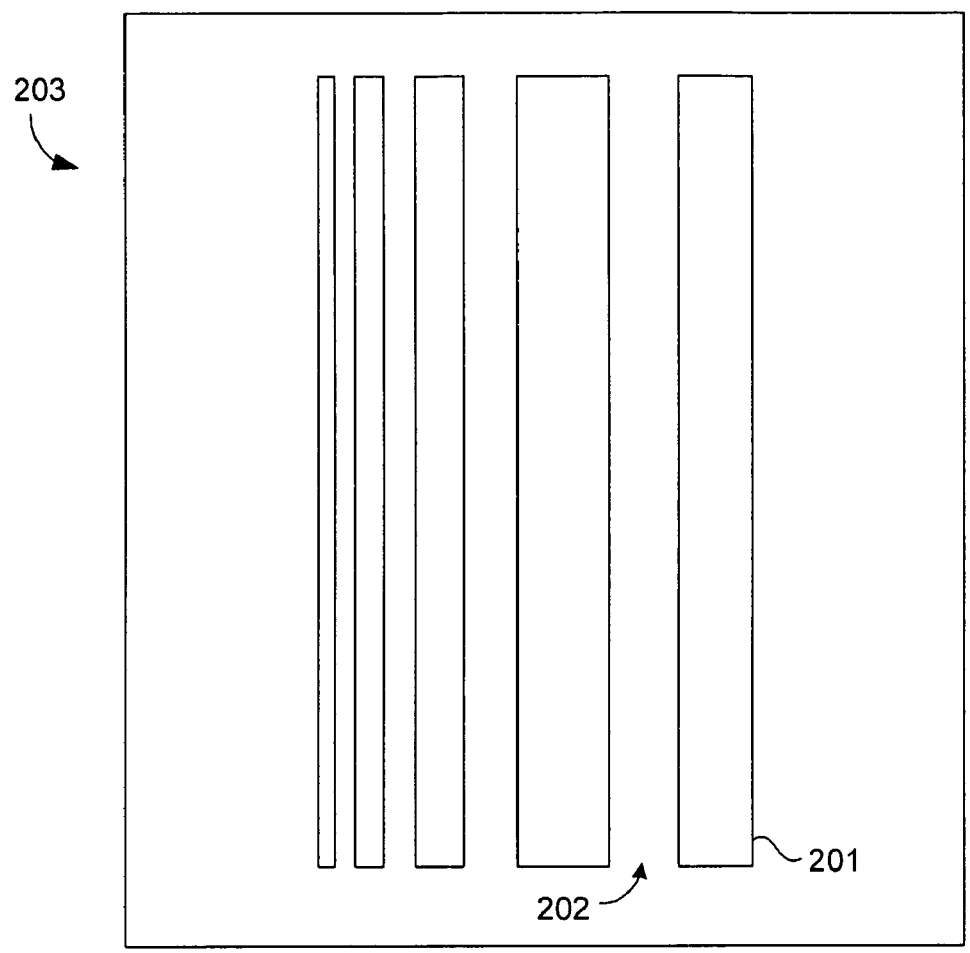
FIG. 3A-B is a test structure on the test mask for phase and amplitude transmittance function measurements of the projection lens system.
Figure 3B:
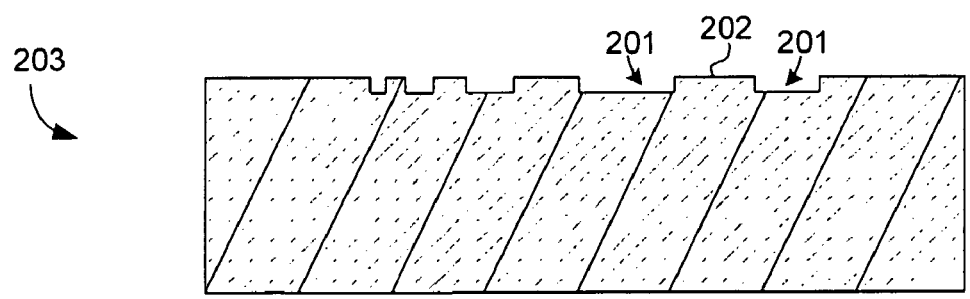

In order to compensate the lens transmission function of a lithography system, the lens system needs to be characterized first. In a preferred embodiment of this invention, the preferred method 1038, simultaneously extracts the phase and the amplitude transmittance functions by measuring the aerial images of the test structures on the mask 101. FIGS. 3A and 3B illustrate a test structure 203, which comprises phase-shifted regions 201 and un-shifted regions 202. The target shown here is for phase shift masks. They can be chrome lines for binary masks or can be attenuated phase-shift structures. Lines (or spaces) 201 and spaces (or lines) 202 have different widths to achieve higher measurement sensitivity. The aerial images of the test structures can be measured at different z defocusing 106, positions (FIG. 2). Different structures have different space widths or line widths to scatter the light into different directions toward the lens pupil. The orientation of the target can also be changed. These aerial images can be measured using photo-detectors, or they can also be measured by printing them onto a photo sensitive layer on a substrate with different exposure doses, and then measuring the resist patterns using scanning electron microscopy (SEM) or other metrology tools. Detailed embodiments of this measurement method are disclosed in a related U.S. patent application, by H. -T. Huang and A. Sezginer, entitled, "Method of Characterizing an Imaging System in Projection Lithography," U.S. Ser. No. 11/203,331, filed concurrently herewith this application.

The measured diffraction aerial images (at focusing and/or defocusing planes) are inverted to obtain the complex transmittance function. The preferred embodiment of this inversion process uses an optimization algorithm, which fits the simulated aerial image to the measurements. The aerial images can be calculated using Hopkin's representation (see, H. H. Hopkins, "On the Diffraction Theory of Optical Images", Proc. Of Royal Soc. Series A., Vol. 217, pp. 408-432, 1953), but other methods can also be used:

$$I(r,f) = \int \int m^*(r-r_1) U^*(r_1,f) J(r_1-r_2) U(r_2,f) m(r-r_2) d^2r_1 d^2r_2 \quad (4)$$

where I is the image intensity, $f$ is a defocus distance, m is the mask transmission function, U is the point spread function in Equation (3), and J is the mutual intensity function, and m(r) is the complex transmission coefficient of the mask at the point r on the plane of the photomask. This description includes the special case of a real-valued mask function. Mask function m(r) maps the 2-dimensional surface of the photomask to its complex-valued, local Fresnel transmission coefficient for transmissive photomasks (reticles) or reflection coefficient for reflective photomasks (reticles). Maskless lithography usually uses reflective lithography. It should be noted that although in the discussions that will follow reference is made to a photomask (mask, or reticle) and its associated photomask data set (target), the present invention is also applicable to maskless lithography, wherein the photomask is replaced by a spatial light modulator. The spatial light modulator has an array of pixels each of which can modulate light that falls on it. The pixels are controlled according to the photomask data. The spatial light modulator typically comprises an array of micro-machined mirrors. The spatial light modulator is illuminated and its image is projected by an objective on to the wafer (see: Sandstrom, et al., U.S. Pat. No. 6,700,095, 2004). In view of the foregoing, the terms "photomask data" set, "mask layout", and "mask target" are used synonymously and they are understood to include maskless lithography data sets.

The mask function assigns an amplitude and a phase shift to each point r=(x,y) on the surface of the photomask. Usually, light that is transmitted through the photomask is projected on to a photoresist layer.

In the transmission mode, the amplitude of the mask function indicates how transparent the photomask is at any point on the photomask. The larger the amplitude, the more transparent is the photomask. In some photolithography instruments, light that is reflected off a photomask is projected on to a photoresist layer.

In the reflective mode, the amplitude of the mask function indicates the reflectivity of the photomask. The larger the amplitude, the more reflective is the photomask.

The phase of the mask function indicates the phase shift the photomask imparts to light that is m(r) is consistent with the Kirchhoff approximation (due to Gustav Kirchhoff 1824-1887) which describes diffraction as an approximately local phenomenon.

A local phenomenon means the electromagnetic field reflected by or transmitted through the mask at the point r=(x, y) on the photomask is influenced only by the illuminating wave and a local property of the mask at the same point. The local property m(r) is the transmission or reflection coefficient of the film stack on the photomask at point r=(x, y).

The film stack includes any etched layer of the fused silica substrate of the photomask and thin films of materials such as, but not limited to, $SiO_2$, TiN, MoSi, Cr deposited on the photomask. The film stack on the photomask is position-dependent since a pattern is etched on the photomask. The film stack is specified by optical refractive index, extinction coefficient, and thickness of each film, and the order of the films on the photomask.

The transmission or reflection coefficient at r is calculated by assuming that the film stack at r extends endlessly in the plane of the photomask. Calculation of the transmission or reflection coefficient of a layered medium is well known (See: J. A. Kong, Electromagnetic Wave Theory, Section 3.4.C, EMW Publishing, Cambridge, Mass., 2000). For binary masks, m(r)=1 in clear areas, and m(r)=0 in opaque areas. In 180° phase-shifted windows on the photomask, m(r)=−1. In general, in a φ-radian phase-shifted window, m(r)=$e^{i\Phi}$. For an attenuated phase-shift feature with power transmission coefficient T, the mask function takes the value: m(r)=$e^{i\Phi}\sqrt{T}$ wherein the nominal value of the phase shift is: φ=π.

The complex transmittance function of the projection lens is imbedded in U as shown in Equation (3). Inversion from the aerial images to the phase and amplitude transmittance functions is generally nonlinear. A nonlinear optimization (or regression) algorithm can be applied to extract the complex transmittance function.

In the regression process, it is efficient to expand the lens transmittance functions by a set of orthogonal functions, such as the Zernike expansion introduced in Equation (1). The lens transmittance function becomes:

$$A(\rho, \theta) \cdot \exp(i\Phi(\rho, \theta)) = 1 + \sum_{(n,m) \neq (0,0)} \sum_{j=1}^{2} \beta_{nmj} R_n^m(\rho) \begin{Bmatrix} \cos \\ \sin \end{Bmatrix}_j (m\theta) \quad (5)$$

where the coefficients $\beta_{nmj}$ are complex in general, $R_n^m(\rho)$ are the Zernike polynomials. Without loss of generality, the piston (constant) term (n,m)=(0, 0) is not included in the sum of aberrations. Plugging this expansion in Equation (3) and (4), the coefficients $\beta_{nmj}$ can be extracted from the optimization process.

It should be noted that the point spread function can be derived from more rigorous methods (for instance, using a vectorial diffraction model instead of the scalar model used here) and may not be in the same integral form as in Equation (3).

Other methods to expand the phase and amplitude transmittance functions are possible. Another way to obtain the lens transmittance function is to set its values at different regions of the exit pupil of the projection lens as unknowns ($\gamma_{nm}$) and extract these unknowns through the regression process. In this notation, indices (n, m) label a region in the exit pupil of the projection lens where the transmission function assumes the value $\gamma_{nm}$.

The set of coefficients $\beta_{nmj}$ are used to reconstruct the complex transmittance function using Equation (5). Alternatively, the set of coefficients $\gamma_{nm}$ are used to map the transmittance function. In a preferred embodiment of this invention, the measured lens transmittance function is then used in the aerial image calculation for the OPC process. By plugging the lens transmittance function into the point spread function in Equation (3), the aerial images of the mask layout can be calculated. The Hopkin's representation in Equation (4) is the most commonly used method for the diffraction aerial image calculation in the OPC process, but the aerial image calculation is not limited to this method.

An optical lithography projector is a partially coherent imaging system. A partially coherent imaging system can be approximated by a finite and incoherent summation of coherent subsystems. The image intensity can be represented by coherent decompositions:

$$I(r, f) = \sum_j \mu_j |V_j(r, f) * m(r)|^2 \qquad (6)$$

where $\mu_j$ are non-negative coefficients, $V_j(r,f)$ are the basis functions (kernels) of the decomposition, and * denotes two-dimensional convolution in the plane of the photomask. This decomposition leads to more efficient calculation, since the basis functions can be pre-computed and remain the same during the OPC calculations.

OPC seeks a mask layout such that according to a computational model of patterning, the pattern that will be printed on the wafer is as close as possible to a target pattern. The computational model of patterning comprises a calculation of the optical image intensity. The preferred embodiment of the OPC process uses an approach of model-based segmentation, and the OPC process includes the following steps:

Step 1: Provide a computational model of the patterning process possibly with some adjustable parameters that are to be determined empirically.

Step 2: Print test patterns, measure aspects of the printed patterns, select the values of the adjustable parameters of the computational model such that a norm of the differences between the measured aspects and the aspects of the pattern predicted by the computational model is minimized.

Step 3: Provide a method to calculate a figure-of-merit of the mask layout from the results of the computational model of the patterning process. The figure-of-merit measures how well the mask layout satisfies a design goal or a desired compromise between multiple goals.

Step 4: Provide an initial guess for the mask layout. For binary and attenuated-PSM masks, the initial guess can be the same as the target layout. The initial guess for the mask layout is not segmented.

Step 5: Assign or update the assignment of edge-movement variables $\Delta_j$, j=1, 2, . . . to the movable edges of the polygons in the mask layout.

Step 6: Find the vector of edge movements $\Delta=[\Delta_1, \Delta_2, \ldots]$ that maximizes the figure-of-merit; and update (transform) the polygons in the mask layout accordingly.

Step 7: Stop if the design goals are met or a predetermined number of iterations are reached. Otherwise, continue to step 8.

Step 8: Calculate the derivative of the figure-of-merit with respect to the displacement of infinitesimal segments of edges at many points along each edge; find the points on the edges at which the derivative changes its sign, or where the magnitude of the derivative significantly changes; and selects a subset of such points as segmentation points according to predetermined rules.

Step 9: Determine whether any new segments were created as a result of step 8. If not, the method ends, otherwise, the method returns to step 6 and proceeds as previously described.

Step 1 includes using the complex transmittance function to form the computational model. The image intensity is calculated according to Equation (6) and the basis functions embody the effect of the complex transmittance function of the projection lens. In addition to the lens transmittance function, other effects can also be included in the computational model, such as mask writing effects caused by mask synthesis, mask etch effects caused by mask synthesis, chromatic effects due to the wavelength spread of illumination, defocus, photoresist blur on the wafer, resist develop, and wafer etch effects. The mask diffraction effects can also be included.

A. Sezginer et al. have taught how to rigorously include the electromagnetic scattering of light illuminated on the photo mask (or spatial light modulators for maskless) in the OPC process (see A. Sezginer, R. Prasad, C.-S. Horng, and H.-T. Huang, "Apparatus and method for photomask design," U.S. patent application Ser. No. 11/203,330 filed together with this application). Furthermore, the computational model can vary in the image field (position dependent).

Step 2 characterizes the projection lens system (and obtains both the phase and amplitude transmittance functions). Characterization can be taken at different locations in the image field. Other characterizations can also be included. Measurements of the aspects of test patterns can also use a photo detector instead of printing the test patterns on the wafer. The phase or amplitude part of the transmittance function of the imaging system can also be provided by a tool vendor or tool user.

Calculating optical proximity corrections based on a computational model of imaging, the model including the complex transmittance function of the projection lens, compensates for the effects of the phase and amplitude aberrations of the lens. More detailed embodiments of the OPC process are disclosed in a related U.S. patent application Ser. No. 11/203, 498, disclosure ID-025, by A. Sezginer, B. Yenikaya, and H.-T. Huang, entitled "An Apparatus and Method for Segmenting Edges for Optical Proximity Correction".

Figure 4:
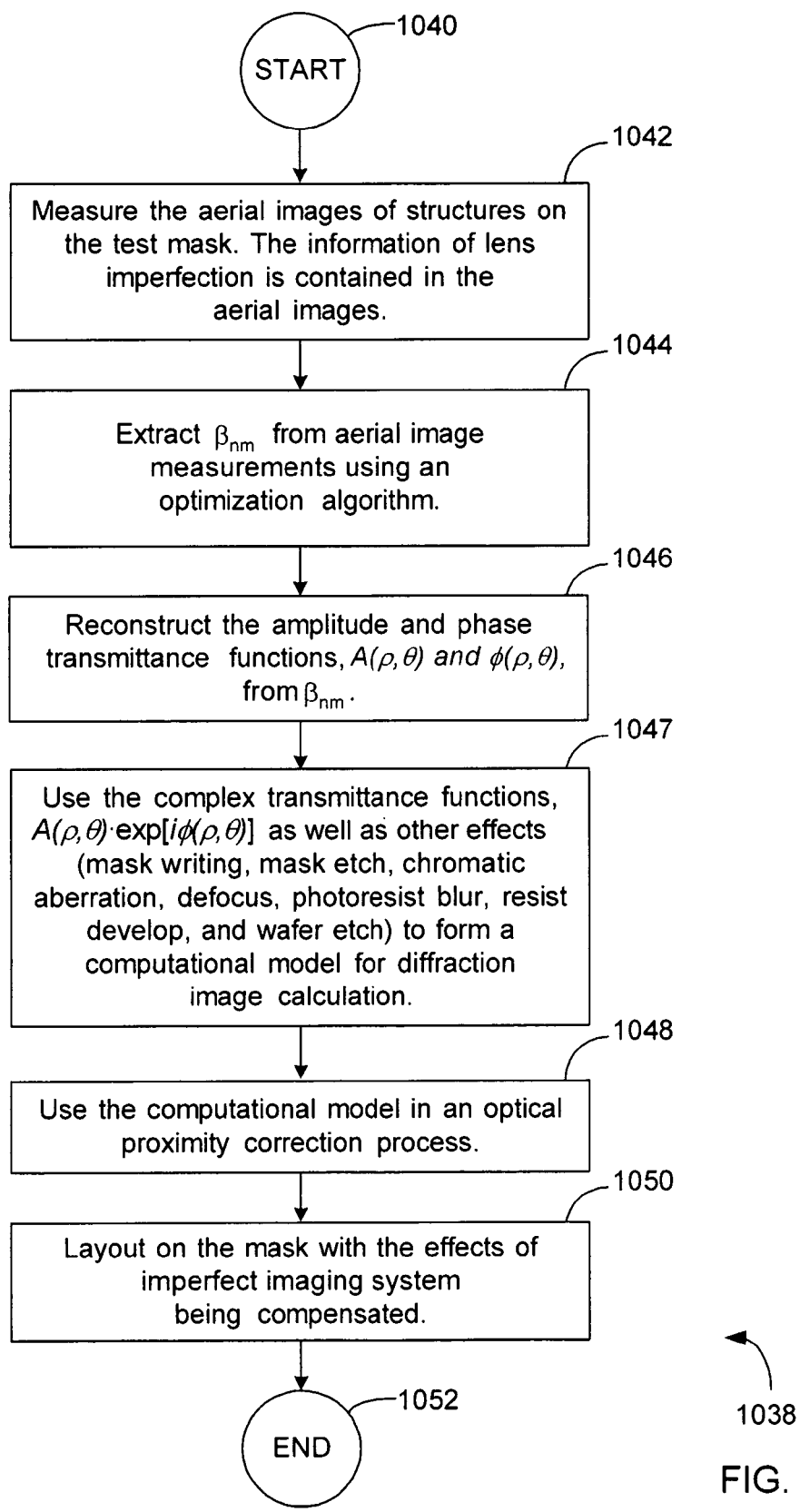
FIG. 4 is a flow chart of a method of compensating a lithography projection tool, which method is in accordance with a preferred method of the present invention.

A flow chart in FIG. 4 summarizes the procedures of a preferred embodiment of this invention. In this regard, as will be explained hereinafter in greater detail, the OPC process is used in a mask synthesis step 1048, where the effects of the imperfect imaging system have been compensated. It should be noted that the optical effects of the underlying layers, which are formed during the patterning process for a device fabrication, can also be lumped into the complex transmittance function. To achieve this, the complex transmittance can be obtained by measuring the diffraction images of test structures on a substrate with the same underlying layers. The extracted coefficients $\beta_{nmj}$ in Equation (5) would contain the optical properties of the underlying layer. Therefore, its effects would also be compensated during the OPC process.

Figure 5A:
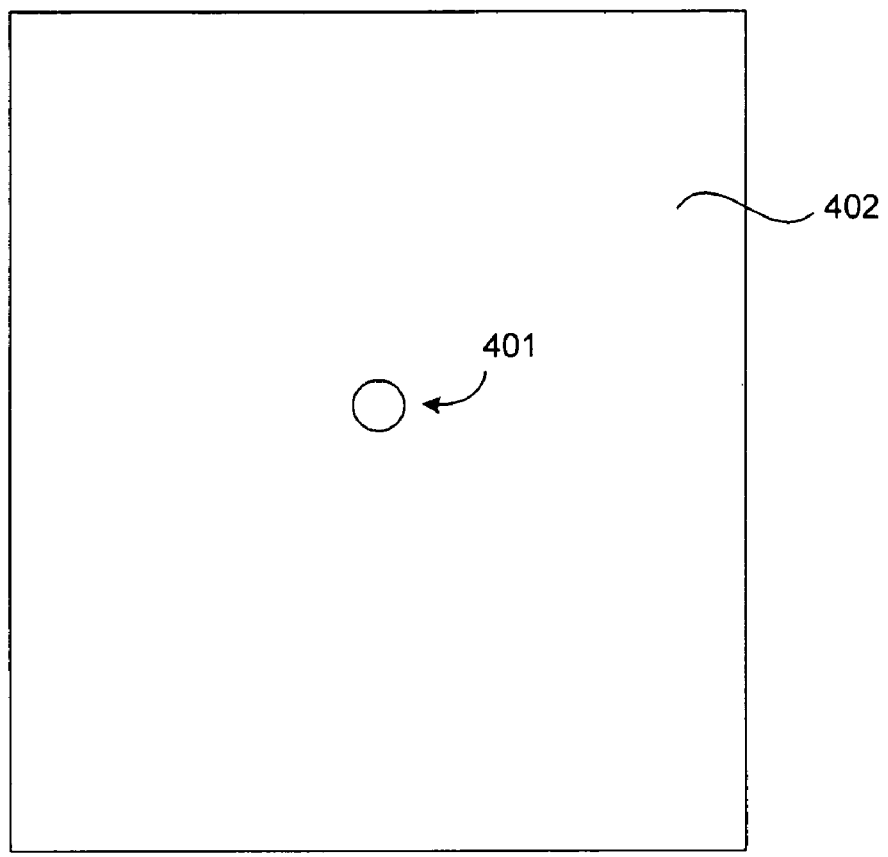
FIG. 5A-B is an alternative embodiment using a pinhole to characterize both the phase and amplitude transmittance functions.
Figure 5B:
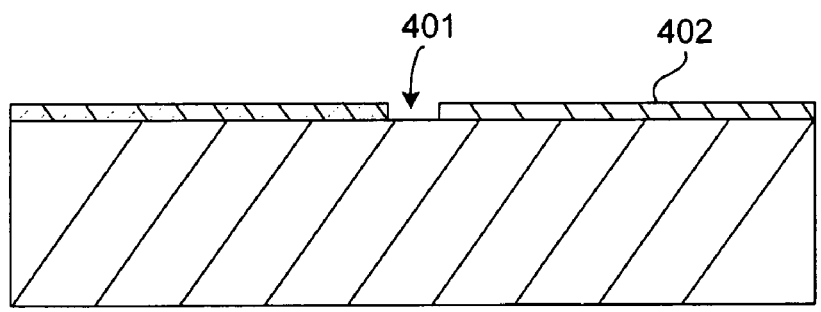

In an alternative preferred embodiment of the present invention, instead of using the test structures shown in FIGS. 3A and 3B, it is possible to utilize other shapes as test structures on the test mask. The test structures can be two or three-dimensional targets. Besides, both phase masks and attenuated masks can be used for the test mask. For instance, an alternative embodiment is using a binary pinhole as the test target. As shown in FIGS. 5A and 5B, a pinhole 401 is created on a binary mask, which can be coated with a chrome layer 402. The aerial images of the pinhole are measured at focusing (and/or defocusing) planes, and analyzed using an optimization algorithm. As described earlier in this application, Equation (3)-(5) can be used in the extraction of the lens transmittance function.

In an alternative embodiment, measured images can be analyzed using the approximate, analytical solutions of point spread functions described in the ENZ approach. See, for example the following references:
1. A. J. E. M. Janssen, "Extended Nijboer-Zernike Approach for the Computation of Optical Point-Spread Functions," (J. Opt. Soc. Am. A., Vol. 19, pp. 849-857, 2002);
2. J. J. M. Braat, P. Dirksen, and A. J. E. M. Janssen, "Assessment of An Extended Nijboer-Zernike Approach for The Computation of Optical Point-Spread Functions," (J. Opt. Soc. Am. A., Vol. 19, pp. 858-870, 2002);
3. P. Dirksen, C. A. H. Juffermans, A. J. E. J. Janssen, "Determining The Aberrations of An Imaging System," (WO 03/056392 A1, 2003); and
4. P. E. Dirksen, J. Braat, A. J. E. M. Janssen, C. Juffermans, "Aberration Retrieval Using The Extended Nijboer-Zernike Approach," (J. Microlith. Microfab, Microsyst. Vol. 2, p. 61, 2003).

For small amplitude and phase transmittances, the aerial image of the pinhole can be expanded as:

$$I(r, f) = U^*(r, f)U(r, f) \approx \qquad (7)$$

$$|W_{00}|^2 + 2 \sum_{(n,m)\neq(0,0)} \sum_{j=1}^{2} \text{Re}(\beta_{nmj}) \Psi_n^m \begin{Bmatrix} \cos \\ \sin \end{Bmatrix}_j (m\phi) +$$

$$2 \sum_{(n,m)\neq(0,0)} \sum_{j=1}^{2} \text{Im}(\beta_{nmj}) \chi_n^m \begin{Bmatrix} \cos \\ \sin \end{Bmatrix}_j (m\phi)$$

$$\Psi_n^m(r, f) = \text{Re}\{i^m W_{00}^*(r, f) W_{nm}(r, f)\}$$

$$\chi_n^m(r, f) = -\text{Im}\{i^m W_{00}^*(r, f) W_{nm}(r, f)\}$$

$$W_{nm}(r, f) = 2\pi U_0$$

$$\int_0^1 \rho \exp\left(if \sqrt{\left(\frac{2\pi n_{IM}}{\lambda}\right)^2 - \left(\frac{2\pi NA\rho}{\lambda}\right)^2}\right) R_n^m(\rho) J_m\left(\frac{2\pi NA\rho}{\lambda}\right) d\rho$$

$J_m$: Bessel functions

Here $n_{IM}$ is the complex refractive index of the immersion fluid between the wafer and the last lens on the image side of the objective. A linear inversion process can be applied to extract the complex transmittance function from Equation (7).

Figure 6A:
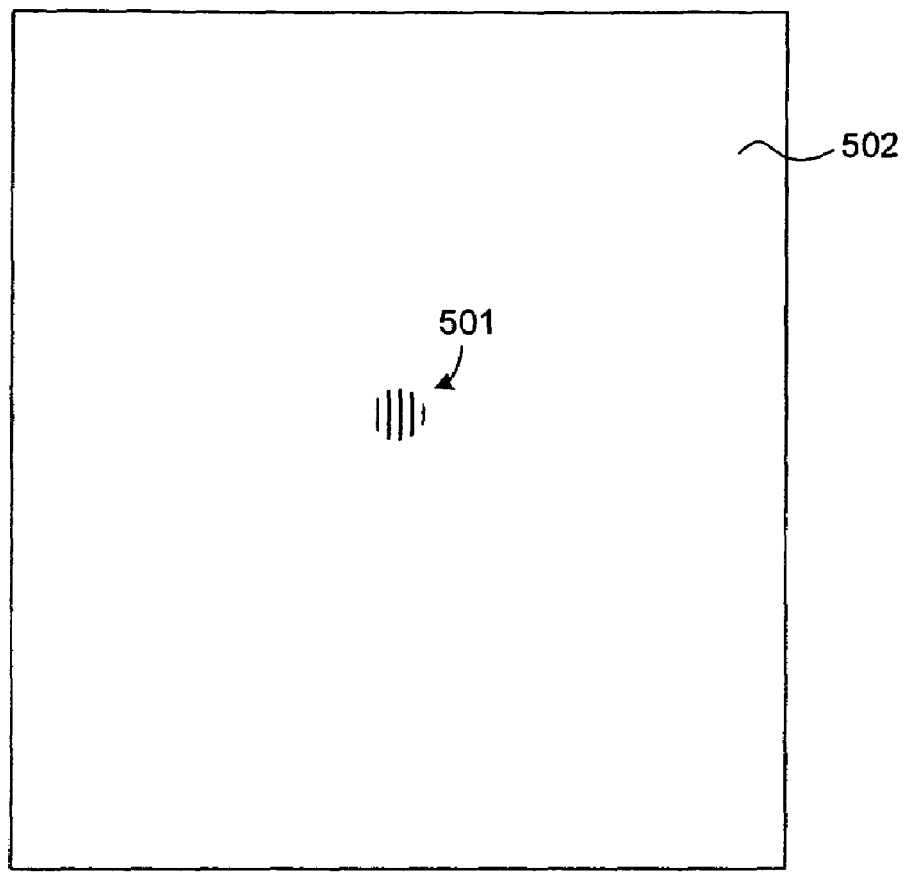
FIG. 6A-B is another alternative embodiment using a pinhole grating to characterize the amplitude transmittance function.
Figure 6B:
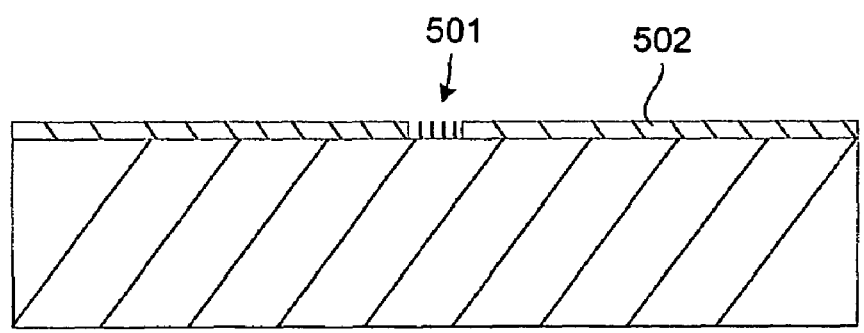

In still yet another preferred embodiment of the present invention, the phase and amplitude transmittance functions are measured separately. Various techniques have been developed to measure the phase distortion (aberration) of a lithography projector. In addition to the above described methods, Sato et. al. teach in U.S. Pat. No. 6,317,198 a method of measuring variations in the magnitude of transmittance. They use pinhole gratings 501 as test structures (shown in FIGS. 6A and 6B). The pitch and the orientation of the gratings can be varied to direct first order diffracted beams toward different locations on the lens pupil. Amplitude transmittance distributions are obtained by evaluating the beam intensities.

Considering now the method 1038 in still greater detail with reference to FIG. 4, the method begins at a start command 1040 and proceeds to a command step 1042. At command step 1042, a measurement of the images of the test structures disposed on the photomask is taken.

Next, the algorithm proceeds to a command step 1044, to extract from the aerial image measurements using an optimization algorithm. In this case the amplitude and phase transmittance functions, $A(\rho, \theta)$ and $\phi(\rho, \theta)$, of the projection lens can be represented by a set of unknowns (e.g. coefficients of orthogonal polynomials) $\beta_{nmj}$.

From the command step 1044, the algorithm proceeds to another command step 1046 which reconstructs the amplitude and phase transmittance functions $A(\rho, \theta)$ and $\phi(\rho, \theta)$ from $\beta_{nmj}$. The algorithm then continues to a command step 1047.

At step 1047, the algorithm forms a computational model which includes the complex transmittance functions, $A(\rho, \theta)$ exp[$i\phi(\rho, \theta)$], as well as other effects (mask writing, mask etch, defocus, photoresist blur, resist develop, and wafer etch) for diffraction image calculation that will be used in the OPC process in the following step 1048.

At step 1048, a (model-based) OPC process using the image computational model formed in step 1047 is used to cause a target layout to be printed on the wafer.

Finally, at a command step 1050, a layout on the mask is generated with the effects of the imperfect imaging system being compensated. The algorithm then goes to an end command 1052 to end the process.

Considering now the computer program product 70 in greater detail with reference to FIG. 1, the computer program product 70 is a computer usable medium that has encoded thereon computer readable codes. The computer readable codes enable a user, via the compensating apparatus 10, to compensate for the effects of an imperfect imaging system in a projection lithography tool. In this regard, the computer readable code causes the computer 30:

1) to obtain both the phase and amplitude parts of a transmittance function of an imaging system in a lithography tool;
2) to form a computational model of patterning that includes the transmittance function of the imaging system; and
3) to synthesize a mask pattern from a given target pattern, by minimizing differences between the target pattern and another pattern that the computational model predicts the synthesized mask pattern will form on a wafer.

In another preferred embodiment of the present invention, the computer readable code causes the computer 30 to compensate for lens imperfections in a projection lithography tool by extracting from a diffraction image created by the projection tool lithography a lens transmittance function and then to use the extracted lens transmittance function as a compensator in the lithography projection tool.

In the preferred embodiment, extracting the lens transmittance function comprises simultaneously extracting both a phase transmittance function and an amplitude transmittance function.

In still yet another preferred embodiment of the present invention, when the lens transmittance function is extracted, the extracting process includes measuring an aerial image of a test structure, where the test structure has a plurality of lines arranged in different configurations.

In still yet another preferred embodiment of the present invention, the aerial image includes at least one phase-shifted region and the measuring includes providing a photo-detector to facilitate obtaining measurement of the aerial image. Moreover, the recording includes using different exposure doses.

In another preferred embodiment, the mask synthesis step 1048 in the method 1038 can be any model-based OPC method. For example, edges of polygons can be segmented according to predetermined rules, which include segmenting edges at predetermined number of points, at predetermined distances from vertices or projection of vertices on neighboring edges of polygons. Other segmentation rules can also be included (see A. K.-K. Wong, "Resolution enhancement techniques in optical lithography," chapter 4, SPIE press). The segmented edges are then moved according to a model-based OPC process, which uses a computational model including the complex transmittance function as well as other effects in calculating the diffraction images (see N. Cobb et al, "Experimental results on optical proximity correction with variable threshold resist model," Proc. of SPIE, vol. 3051, pp. 458-468, 2997).

In still another preferred embodiment of the mask synthesis step 1048, assist-features can be added. The assist-features are sub-resolution, so they are not printed on the wafer. However, they would coherent or incoherently interfere with the main pattern. Phase-shift can be assigned to the assist-features. These sub-resolution assist-features can be added during the (model-based) OPC process (J. F. Chen et al, "Optical proximity correction for intermediate-pitch features using sub-resolution scattering bars," J. Vac. Sci. Technol. B, vol. 15, no. 6, pp. 2426-2433, 1997). By using the assist-features in the OPC process, the depth of focus and the depth of dose are increased, so are the other parameters in the lithography process window. Model-based assist-feature generation can also be used in the mask synthesis step 1048 (see A. Sezginer, "Method and apparatus of model-based photomask synthesis," U.S. patent application Ser. No. 11/203,505, filed together with this application). Other methods of segmentation or assist-feature insertion can be used in combination in the model-based OPC process in step 1048 in method 1038. For example, the published article by M. Hsu et al., entitled "Lithography manufacturing implementation for 65 nm and 45 nm Nodes with model-based scattering bars using IML™ Technology," (SPIE v. 5754, p. 355, 2005.)

In still yet another preferred embodiment of the mask synthesis step 1048, the photomask is synthesized with continuously varying amplitude or phase of transmittance. The photomask is preferred designed by using the Fréchet derivative and the steepest descent iteration:

$$m^{(n+1)} = m^{(n)} - \gamma \left[ \frac{\delta F_1 m}{\text{Re}\delta m} + i \frac{\delta F_1 m}{\text{Im}\delta m} \right]^{(n)}$$

$\gamma$ is such that: $F_1 m^{(n+1)} < F_1 m^{(n)}$ where m is the mask transmittance as a function of position on the mask, the superscript $^{(n)}$ is the iteration number and $i^2=-1$, the step size $\gamma$ is set to a predetermined positive number, $F_1$ is a functional that maps a mask transmission function m to a non-negative real number which is a figure-of-demerit, and the function $$\frac{\delta F}{\delta m}$$

is called the Fréchet derivative of the functional F. Detailed embodiment of this mask synthesis approach is disclosed in another U.S. patent application Ser. No. 11/203,505 by A. Sezginer, entitled, "Method and Apparatus of Model-Based Photomask Synthesis," which is filed concurrently with this application.

In the preferred embodiment, the computer readable code has been described as being encoded on a disc 70 that can be entered into the computer memory 40 by the disc drive 22, which reads and transfers the code under computer control.

However, it is contemplated that the code could be entered remotely from another computer, through a high speed cable or satellite connection, or directly from or any other input device that is capable of communication with the computer 30. Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

What is claimed is:

1. A method of synthesizing a photomask pattern, comprising:
    obtaining a phase and an amplitude of a transmittance function of an imaging system including a projection lens system;
    forming a computational model of patterning that includes the phase and the amplitude of the transmittance function of the imaging system;
    synthesizing a mask pattern from a given target pattern by minimizing differences between the target pattern and another pattern that the computational model predicts the synthesized mask pattern will form on a wafer;
    and storing said synthesized mask pattern for later use in photomask construction;
    wherein said computational model also includes at least one of the following effects: chromatic effects caused by wavelength spreading of illumination; mask writing effects caused by mask synthesis; mask etch effects caused by mask synthesis; photoresist blur on the wafer; photoresist development effects; and wafer etch effects.

2. The method of synthesizing a photomask pattern according to claim 1, said step of obtaining further comprising:
    using an interferometer placed in a lithography projector.

3. The method of synthesizing a photomask pattern according to claim 1, said step of obtaining further comprising:
    forming an image of a test structure on a light detector;
    measuring aspects of said image with said detector to obtain measurements;
    and extracting said transmittance function from said measurements.

4. The method of synthesizing a photomask pattern according to claim 1, said step of obtaining further comprising:
    printing an image of a test structure on a wafer;
    measuring aspects of said image printed on said wafer to obtain measurements;
    and extracting said transmittance function from said measurements.

5. The method of synthesizing a photomask pattern according claim 4, further comprising:
    depositing a stack of films on said wafer prior to said step of printing, said stack of films having substantially the same thicknesses and compositions as layers on a wafer at a manufacturing stage of a device.

6. The method of synthesizing a photomask pattern according claim 4, wherein said test structure has a phase shifted feature.

7. The method of synthesizing a photomask pattern according claim 4, wherein said test structure has lines and spaces.

8. The method of synthesizing a photomask pattern according claim 7, wherein said lines and spaces have more than one line width, space width, and orientation.

9. The method of synthesizing a photomask pattern according to claim 4, further comprising:
    using a generalized line-grating as said test structure, wherein said generalized line- grating has a plurality of parallel lines and spaces;

and wherein at least two lines have different widths or at least two spaces have different widths.

10. The method according to claim 4, wherein said step of measuring further comprises: recording said image on a photosensitive layer disposed on a substrate.

11. The method according to claim 10, wherein said step of recording is repeated using more than one exposure dose.

12. The method according to claim 10, further comprising measuring dimensions of a pattern formed on said photosensitive layer by a scanning electron microscope.

13. The method according to claim 10, further comprising measuring dimensions of a pattern formed on said photosensitive layer by an atomic force microscope.

14. The method according to claim 10, further comprising measuring dimensions of a pattern formed on said photosensitive layer by optical scatterometry.

15. The method according to claim 10, further comprising:
etching a pattern formed on said photosensitive layer into said substrate, or into another layer disposed between said substrate and said photosensitive layer; and
measuring dimensions of the etched pattern to obtain measurements.

16. The method according to claim 15, wherein said dimension are electrically measured.

17. The method according to claim 4, wherein said step of measuring an image is repeated using more than one value of defocus.

18. The method of synthesizing a photomask pattern according to claim 1, wherein different values of said transmittance function are obtained in more than one location in an image field.

19. The method of synthesizing a photomask pattern according to claim 1, wherein said step of synthesizing comprises performing optical proximity correction.

20. The method of synthesizing a photomask pattern according to claim 1, wherein said step of synthesizing comprises assigning a phase shift to a feature on the photomask.

21. The method of synthesizing a photomask pattern according to claim 1, wherein said step of synthesizing comprises assigning a transmission change to a feature on the photomask.

22. The method of synthesizing a photomask pattern according to claim 1, wherein said step of synthesizing comprises placing sub-resolution assist features on said photomask.

23. The method according to claim 1, wherein said step of synthesizing a mask pattern further comprises:
providing an initial mask pattern;
using said computational model of patterning to compute a figure-of-merit that measures how well said initial mask pattern satisfies a design goal;
adjusting said initial mask pattern as a result of the figure-of-merit;
storing said adjusted mask pattern for use in synthesizing a mask pattern.

24. The method according to claim 23, wherein said synthesized mask pattern is said adjusted mask pattern.

25. The method according to claim 23, wherein said provided initial mask pattern is the stored adjusted mask pattern of a previous application of the method according to claim 23.

26. The method according to claim 23, wherein said initial mask pattern is a target layout.

27. The method according to claim 23, wherein said step of adjusting said initial mask pattern further comprises either:
adjusting position of edges of said initial mask pattern; or
creating new edges for said initial mask pattern; or
both.

28. A method to compensate the effects of an imperfect imaging system in a projection lithography tool, comprising:
obtaining both the phase and amplitude parts of a transmittance function of an imaging system including a projection lens system in a lithography tool;
forming a computational model of patterning that includes the amplitude and phase maps of the imaging system;
synthesizing a mask pattern from a given target pattern, such that the computational model predicts the extent to which the synthesized mask pattern will substantially form the target pattern on the wafer;
and storing said synthesized mask pattern for later use in photomask construction;
wherein said computational model also includes at least one of the following effects: chromatic effects caused by wavelength spreading of illumination; mask writing effects caused by mask synthesis; mask etch effects caused by mask synthesis; photoresist blur on the wafer; photoresist development effects; and wafer etch effects.

29. The method of synthesizing a photomask pattern according to claim 28, wherein different values of said transmittance function are obtained in more than one location in an image field.

30. The method of synthesizing a photomask pattern according to claim 28, wherein said step of synthesizing comprises performing optical proximity correction.

31. The method of synthesizing a photomask pattern according to claim 28, wherein said step of synthesizing comprises assigning a phase shift to a feature on the photomask.

32. The method of synthesizing a photomask pattern according to claim 28, wherein said step of synthesizing comprises assigning a transmission change to a feature on the photomask.

33. The method of synthesizing a photomask pattern according to claim 28, wherein said step of synthesizing comprises placing sub-resolution assist features on said photomask.

34. The method of synthesizing a photomask pattern according to claim 28, wherein said step of obtaining includes:
using a generalized line-grating as said test structure, wherein said generalized line-grating has a plurality of parallel lines and spaces; and wherein at least two lines have different widths or at least two spaces have different widths.

35. The method according to claim 28, wherein said step of synthesizing a mask pattern further comprises:
providing an initial mask pattern;
using said computational model of patterning to compute a figure-of-merit that measures how well said initial mask pattern satisfies a design goal;
adjusting said initial mask pattern as a result of the figure-of-merit;
storing said adjusted mask pattern for use in synthesizing a mask pattern.

* * * * *